United States Patent
Xu

(10) Patent No.: US 9,243,502 B2
(45) Date of Patent: Jan. 26, 2016

(54) AIRFOIL COOLING ENHANCEMENT AND METHOD OF MAKING THE SAME

(75) Inventor: JinQuan Xu, Groton, CT (US)

(73) Assignee: UNITED TECHNOLOGIES CORPORATION, Hartford, CT (US)

( * ) Notice: Subject to any disclaimer, the term of this patent is extended or adjusted under 35 U.S.C. 154(b) by 909 days.

(21) Appl. No.: 13/454,180

(22) Filed: Apr. 24, 2012

(65) Prior Publication Data

US 2013/0280092 A1    Oct. 24, 2013

(51) Int. Cl.
*B22F 5/00* (2006.01)
*F01D 5/18* (2006.01)
*B22F 3/105* (2006.01)
*B23P 15/02* (2006.01)

(52) U.S. Cl.
CPC .............. *F01D 5/187* (2013.01); *B22F 3/1055* (2013.01); *B23P 15/02* (2013.01); *F05D 2230/31* (2013.01); *F05D 2250/241* (2013.01); *F05D 2260/2214* (2013.01); *Y10T 29/49336* (2015.01); *Y10T 29/49341* (2015.01)

(58) Field of Classification Search
CPC ...................... B22F 1/1055; B22F 3/10553
See application file for complete search history.

(56) References Cited

U.S. PATENT DOCUMENTS

| | | | |
|---|---|---|---|
| 2,343,918 A | 5/1943 | McCoy | |
| 4,248,094 A | 2/1981 | Thompson et al. | |
| 4,490,649 A | 12/1984 | Wang | |
| 4,596,917 A | 6/1986 | Nied et al. | |
| 4,815,939 A | 3/1989 | Doble | |
| 5,038,014 A | 8/1991 | Pratt et al. | |
| 5,060,914 A | 10/1991 | Wang et al. | |
| 5,164,097 A | 11/1992 | Wang et al. | |
| 5,165,860 A | 11/1992 | Stoner et al. | |
| 5,250,136 A | 10/1993 | O'Connor | |
| 5,271,715 A | 12/1993 | Zelesky et al. | |
| 5,314,000 A | 5/1994 | Wang et al. | |
| 5,558,497 A | 9/1996 | Kraft et al. | |
| 5,608,637 A | 3/1997 | Wang et al. | |
| 5,740,074 A | 4/1998 | Wang et al. | |
| 5,837,960 A | 11/1998 | Lewis et al. | |

(Continued)

FOREIGN PATENT DOCUMENTS

| | | |
|---|---|---|
| EP | 1 365 108 | 11/2003 |
| JP | 2009-047085 A | 3/2009 |

OTHER PUBLICATIONS

International Search Report for PCT Application No. PCT/US2013/037344, Jul. 25, 2013.

(Continued)

*Primary Examiner* — George Wyszomierski
*Assistant Examiner* — Ngoclan T Mai
(74) *Attorney, Agent, or Firm* — Carlson, Gaskey & Olds, P.C.

(57) ABSTRACT

An airfoil includes a body that includes leading and trailing edges joined by spaced apart pressure and suction sides to provide an exterior airfoil surface. A cooling passage is arranged interiorly of the exterior airfoil surface and provides an interior surface. The interior cooling surface includes micro-bumps that protrude from the interior cooling surface into the cooling passage. The micro-bumps are discrete from and noncontiguous relative to one another in multiple directions along the interior cooling surface. The micro-bumps may be provided while forming the airfoil or using correspondingly shaped micro-depressions on an airfoil core.

11 Claims, 4 Drawing Sheets

(56) References Cited

U.S. PATENT DOCUMENTS

| | | |
|---|---|---|
| 5,926,393 A | 7/1999 | Wang et al. |
| 5,939,006 A | 8/1999 | Wang et al. |
| 6,126,741 A | 10/2000 | Jones et al. |
| 6,142,734 A | 11/2000 | Lee |
| 6,200,439 B1 | 3/2001 | Wei et al. |
| 6,246,918 B1 | 6/2001 | Wang et al. |
| 6,256,597 B1 | 7/2001 | Wang et al. |
| 6,264,822 B1 | 7/2001 | Wei et al. |
| 6,267,868 B1 | 7/2001 | Wei et al. |
| 6,290,461 B1 | 9/2001 | Wei et al. |
| 6,379,528 B1 | 4/2002 | Lee et al. |
| 6,387,242 B1 | 5/2002 | Wei et al. |
| 6,391,251 B1 | 5/2002 | Keicher et al. |
| 6,416,283 B1 | 7/2002 | Johnson et al. |
| 6,505,673 B1 | 1/2003 | Abuaf et al. |
| 6,554,571 B1 | 4/2003 | Lee et al. |
| 6,669,447 B2 | 12/2003 | Norris et al. |
| 6,691,019 B2 | 2/2004 | Seeley et al. |
| 6,743,350 B2 | 6/2004 | Lee et al. |
| 6,850,810 B1 | 2/2005 | Wang et al. |
| 6,998,753 B2 | 2/2006 | Irwin et al. |
| 7,010,474 B1 | 3/2006 | Wang et al. |
| 7,026,554 B2 | 4/2006 | Lee et al. |
| 7,029,232 B2 | 4/2006 | Tuffs et al. |
| 7,112,044 B2 | 9/2006 | Whitehead et al. |
| 7,121,800 B2 | 10/2006 | Beattie |
| 7,121,801 B2 | 10/2006 | Surace et al. |
| 7,125,225 B2 | 10/2006 | Surace et al. |
| 7,137,776 B2 | 11/2006 | Draper et al. |
| 7,144,220 B2 | 12/2006 | Marcin, Jr. |
| 7,217,093 B2 | 5/2007 | Propheter et al. |
| 7,270,517 B2 | 9/2007 | Garner |
| 7,306,026 B2 | 12/2007 | Memmen |
| 7,395,593 B2 | 7/2008 | Wang et al. |
| 7,413,001 B2 | 8/2008 | Wang et al. |
| 7,478,994 B2 | 1/2009 | Cunha et al. |
| 7,487,819 B2 | 2/2009 | Wang et al. |
| 7,624,787 B2 | 12/2009 | Lee et al. |
| 7,686,065 B2 | 3/2010 | Luczak |
| 7,686,582 B2 | 3/2010 | Cunha |
| 7,690,893 B2 | 4/2010 | Cunha |
| 7,695,582 B2 | 4/2010 | Stowell et al. |
| 7,699,583 B2 | 4/2010 | Cunha |
| 7,717,675 B1 | 5/2010 | Liang |
| 7,722,916 B2 | 5/2010 | Wang et al. |
| 7,832,081 B2 | 11/2010 | Wang et al. |
| 7,857,588 B2 | 12/2010 | Propheter-Hinckley et al. |
| 7,919,151 B2 | 4/2011 | Deng et al. |
| 7,938,168 B2 | 5/2011 | Lee et al. |
| 7,988,418 B2 | 8/2011 | Cunha et al. |
| 8,109,725 B2 | 2/2012 | Abdel-Messeh et al. |
| 8,109,735 B2 | 2/2012 | Gage et al. |
| 2003/0120415 A1 | 6/2003 | Seeley et al. |
| 2003/0173213 A1 | 9/2003 | Lee et al. |
| 2003/0206820 A1* | 11/2003 | Keicher et al. ............... 419/9 |
| 2004/0076519 A1 | 4/2004 | Halfmann et al. |
| 2004/0263020 A1 | 12/2004 | Irwin et al. |
| 2004/0263021 A1 | 12/2004 | Irwin et al. |
| 2005/0006047 A1 | 1/2005 | Wang et al. |
| 2005/0012424 A1 | 1/2005 | Irwin et al. |
| 2005/0072592 A1 | 4/2005 | Lee et al. |
| 2005/0204543 A1 | 9/2005 | Wang et al. |
| 2005/0205232 A1 | 9/2005 | Wang et al. |
| 2006/0021730 A1 | 2/2006 | Marcin, Jr. |
| 2006/0090871 A1 | 5/2006 | Snyder et al. |
| 2006/0093480 A1 | 5/2006 | Cunha et al. |
| 2006/0107668 A1 | 5/2006 | Cunha et al. |
| 2006/0266285 A1 | 11/2006 | Fernihough et al. |
| 2006/0273073 A1 | 12/2006 | Paauwe et al. |
| 2007/0059171 A1 | 3/2007 | Simms et al. |
| 2007/0201980 A1 | 8/2007 | Morris et al. |
| 2007/0281074 A1 | 12/2007 | Wang et al. |
| 2007/0284411 A1 | 12/2007 | Luczak |
| 2007/0285198 A1 | 12/2007 | Farquhar et al. |
| 2008/0135202 A1 | 6/2008 | Lee et al. |
| 2008/0135530 A1 | 6/2008 | Lee et al. |
| 2008/0135718 A1 | 6/2008 | Lee et al. |
| 2008/0135721 A1 | 6/2008 | Wang et al. |
| 2008/0135722 A1 | 6/2008 | Wang et al. |
| 2008/0190582 A1 | 8/2008 | Lee et al. |
| 2008/0216303 A1 | 9/2008 | Wang et al. |
| 2008/0290215 A1 | 11/2008 | Udall et al. |
| 2009/0047136 A1 | 2/2009 | Chon et al. |
| 2009/0074575 A1 | 3/2009 | Propheter-Hinckley et al. |
| 2009/0183850 A1* | 7/2009 | Morrison et al. ............... 164/91 |
| 2009/0208325 A1 | 8/2009 | Devore et al. |
| 2009/0238695 A1 | 9/2009 | Devore et al. |
| 2009/0258168 A1 | 10/2009 | Barcock |
| 2009/0304497 A1 | 12/2009 | Meier et al. |
| 2010/0025001 A1 | 2/2010 | Lee et al. |
| 2010/0034647 A1 | 2/2010 | Lee et al. |
| 2010/0232946 A1 | 9/2010 | Propheter-Hinckley et al. |
| 2010/0310367 A1 | 12/2010 | Devore et al. |
| 2011/0033312 A1 | 2/2011 | Lee et al. |
| 2011/0048664 A1 | 3/2011 | Kush et al. |
| 2011/0123310 A1 | 5/2011 | Beattie et al. |
| 2011/0123311 A1 | 5/2011 | Devore et al. |
| 2011/0135952 A1 | 6/2011 | Morris et al. |
| 2011/0274559 A1 | 11/2011 | Jenne et al. |
| 2011/0286857 A1 | 11/2011 | Gleiner et al. |
| 2011/0293434 A1 | 12/2011 | Lee et al. |

OTHER PUBLICATIONS

International Preliminary Report on Patentability for PCT Application No. PCT/US2013/037344 mailed Nov. 6, 2014.

* cited by examiner

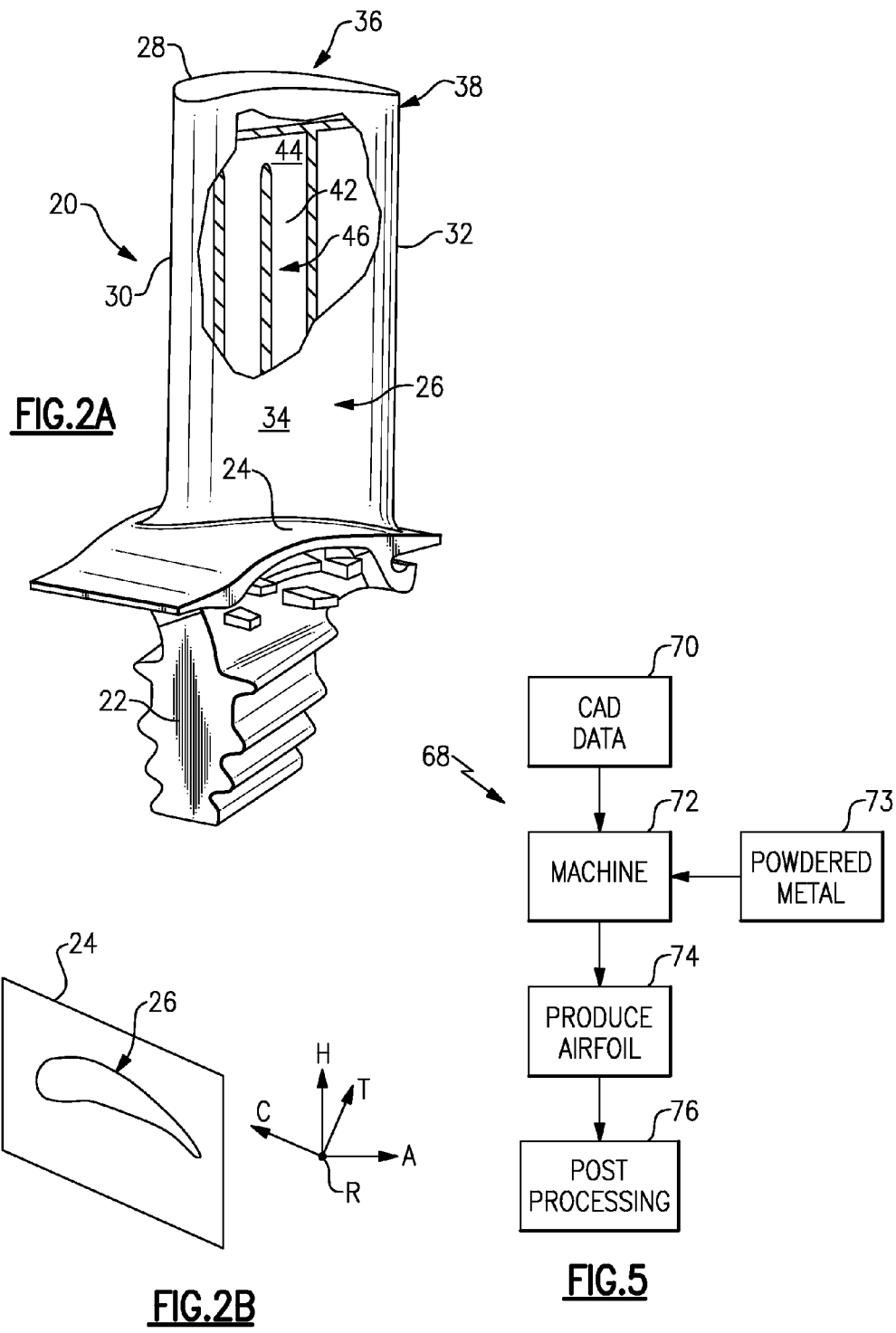

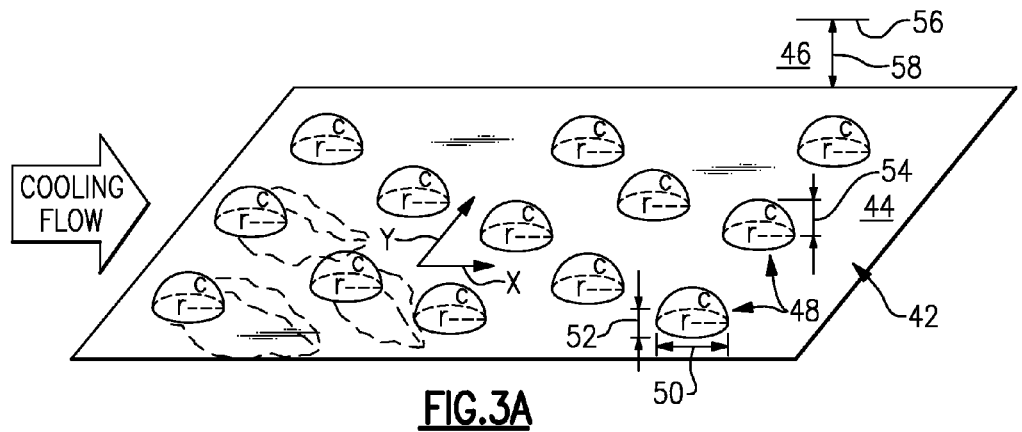
FIG.3A
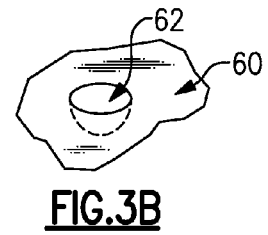
FIG.3B
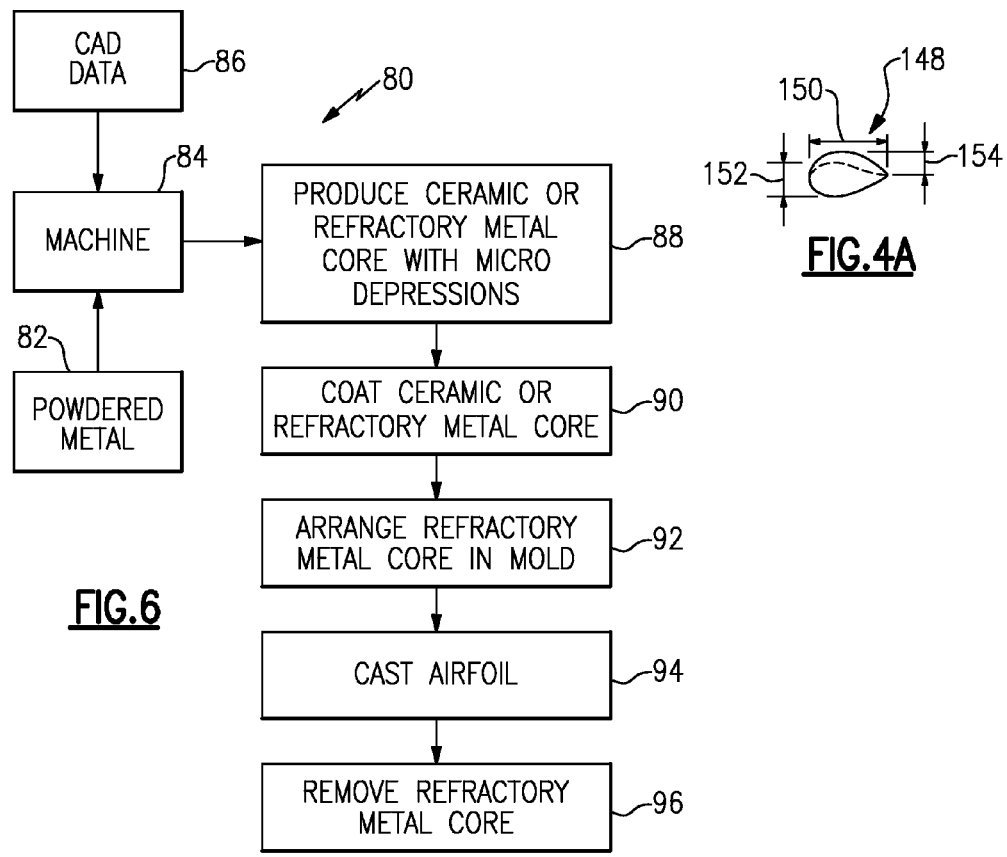
FIG.4A
FIG.6

AIRFOIL COOLING ENHANCEMENT AND METHOD OF MAKING THE SAME

BACKGROUND

This disclosure relates to an airfoil for a gas turbine engine. In particular, the disclosure relates to a cooling enhancement feature for an interior cooling passage of the airfoil and a method of making the same.

Gas turbine engine turbine airfoils typically include complex cooling passages. The cooling passages often include features to increase heat transfer between the airfoil and the cooling fluid flowing through the cooling passage. One cooling enhancement technique has been to provide very small linear grooves adjoining one another. These grooves provide a contiguous ridge that typically extends in a radial direction and increase the surface area of an interior cooling surface.

Another cooling enhancement technique has been to provide pins that extend between and join opposing walls of the cooling passage, creating turbulence in the cooling passage. These pins significantly obstruct the cooling flow and do not necessarily increase heat transfer significantly on an exterior airfoil wall.

Yet another cooling enhancement technique is to provide micro-depressions in the interior cooling surface of the airfoil. This is achieved by milling or electrodischarge machining correspondingly shaped pins on the airfoil core, which is very costly.

SUMMARY

In one exemplary embodiment, an airfoil includes a body that includes leading and trailing edges joined by spaced apart pressure and suction sides to provide an exterior airfoil surface. A cooling passage is arranged interiorly of the exterior airfoil surface and provides an interior surface. The interior cooling surface includes micro-bumps that protrude from the interior cooling surface into the cooling passage. The micro-bumps are discrete from and noncontiguous relative to one another in multiple directions along the interior cooling surface.

In a further embodiment of any of the above, at least one of the micro-bumps includes a generally spherical cap.

In a further embodiment of any of the above, at least one of the micro-bumps is teardrop shaped.

In a further embodiment of any of the above, the cooling passage is provided by opposing cooling surfaces. Each of the opposing cooling surfaces includes first and second micro-bumps that are offset relative to one another.

In a further embodiment of any of the above, the interior cooling surface includes first and second micro-bumps adjacent to one another and separated by a length in a stream-wise direction, wherein the length is about 1 to 10 times a micro-bump length, and the first and second micro-bumps are separated in a span-wise direction perpendicular to the stream-wise direction a width, wherein the width is about 0.5 to 5 times a micro-bump width.

In a further embodiment of any of the above, the micro-bump length and micro-bump width are the same and correspond to a radius that provides a circular base to the micro-bump on the interior cooling surface.

In a further embodiment of any of the above, the interior cooling surface and the micro-bumps include a uniform microstructure relative to one another.

In a further embodiment of any of the above, the micro-bumps are noncontiguous from one another about 360° each micro-bump along the interior cooling surface.

In a further embodiment of any of the above, the micro-bumps include a height configured to be 10% to 200% of a flow boundary layer thickness along the interior cooling surface.

In a further embodiment of any of the above, at least one of the micro-bumps include smaller micro-bumps.

In one exemplary embodiment, a method of manufacturing an airfoil includes the steps of depositing multiple layers of powdered metal onto one another, joining the layers to one another with reference to CAD data relating to a particular cross-section of an airfoil, and producing the airfoil with leading and trailing edges joined by spaced apart pressure and suction sides to provide an exterior airfoil surface. A cooling passage is arranged interiorly of the exterior airfoil surface and provides an interior surface. The interior cooling surface includes micro-bumps that protrude from the interior cooling surface into the cooling passage. The micro-bumps are discrete from and noncontiguous relative to one another in multiple directions along the interior cooling surface.

In a further embodiment of any of the above, the method of manufacturing includes the step processing the airfoil to provide desired structural characteristics.

In a further embodiment of any of the above, the processing step includes heating the airfoil to reconfigure the joined layers into at least one of an equi-axed structure, directionally solidified structure and single crystalline structure.

In a further embodiment of any of the above, at least one of the micro-bumps includes a generally spherical cap.

In a further embodiment of any of the above, at least one of the micro-bumps is teardrop shaped.

In a further embodiment of any of the above, the cooling passage is provided by opposing cooling surfaces. Each of the opposing cooling surfaces includes first and second micro-bumps that are offset relative to one another.

In a further embodiment of any of the above, the interior cooling surface includes first and second micro-bumps adjacent to one another and separated by a length in a stream-wise direction, wherein the length is about 1 to 10 times a micro-bump length, and the first and second micro-bumps are separated in a span-wise direction perpendicular to the stream-wise direction a width, wherein the width is about 0.5 to 5 times a micro-bump width.

In a further embodiment of any of the above, the micro-bump length and micro-bump width are the same and correspond to a radius that provides a circular base to the micro-bump on the interior cooling surface.

In a further embodiment of any of the above, the interior cooling surface and the micro-bumps include a uniform microstructure relative to one another.

In a further embodiment of any of the above, the micro-bumps are noncontiguous from one another about 360° each micro-bump along the interior cooling surface.

In a further embodiment of any of the above, the micro-bumps include a height configured to be 10% to 200% of a flow boundary layer thickness along the interior cooling surface.

In a further embodiment of any of the above, at least one of the micro-bumps include smaller micro-bumps.

In one exemplary embodiment, a method of manufacturing a core for an airfoil includes the steps of providing a core with a portion corresponding to a cooling passage. The core provides a surface that includes micro-depressions recessed from the surface into the core. The micro-depressions are discrete from and noncontiguous relative to one another in multiple directions along the surface.

In a further embodiment of any of the above, the method of manufacturing includes the steps of depositing multiple layers of powdered metal onto one another, joining the layers to one another with reference to CAD data relating to a particular cross-section of the core.

In a further embodiment of any of the above, the core includes opposing surfaces. Each of the opposing surfaces includes first and second micro-depressions that are offset relative to one another.

In a further embodiment of any of the above, the surface includes first and second micro-depressions adjacent to one another and separated by a length in a stream-wise direction, wherein the length is about 1 to 10 times a micro-depression length, and the first and second micro-depressions are separated in a span-wise direction perpendicular to the stream-wise direction a width, wherein the width is about 0.5 to 5 times a micro-depression width.

In a further embodiment of any of the above, the micro-depressions are noncontiguous from one another about 360° each micro-depressions along the interior cooling surface.

In a further embodiment of any of the above, the method of manufacturing includes the steps of depositing multiple layers of ceramic or ceramic slurry onto one another, joining the layers to one another with reference to CAD data relating to a particular cross-section of the core.

BRIEF DESCRIPTION OF THE DRAWINGS

The disclosure can be further understood by reference to the following detailed description when considered in connection with the accompanying drawings wherein:

FIG. 2A is a perspective view of the airfoil having the disclosed cooling passage.

FIG. 2B is a plan view of the airfoil illustrating directional references.

FIG. 3A schematically depicts an interior cooling surface of an airfoil cooling passage.

FIG. 3B schematically depicts a core having a micro-depression for producing a correspondingly shaped micro-bump on the interior cooling surface.

FIG. 4A illustrates another shape of an example micro-bump.

FIG. 5 is a flow chart depicting an example airfoil manufacturing process.

FIG. 6 is a flow chart depicting an example core manufacturing process.

DETAILED DESCRIPTION

Figure 1:
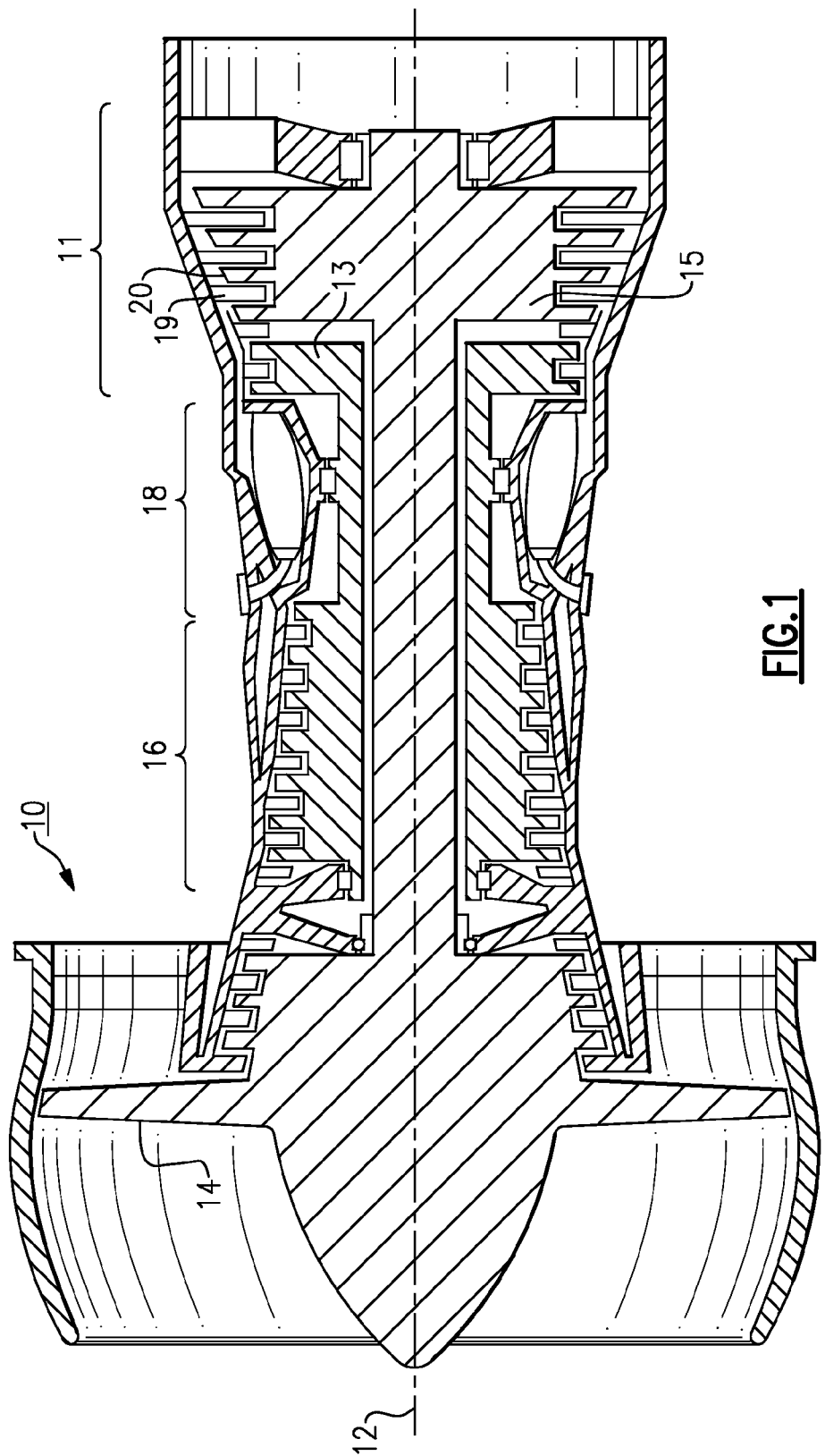
FIG. 1 is a schematic view of a gas turbine engine incorporating the disclosed airfoil.

FIG. 1 schematically illustrates a gas turbine engine 10 that includes a fan 14, a compressor section 16, a combustion section 18 and a turbine section 11, which are disposed about a central axis 12. As known in the art, air compressed in the compressor section 16 is mixed with fuel that is burned in combustion section 18 and expanded in the turbine section 11. The turbine section 11 includes, for example, rotors 13 and 15 that, in response to expansion of the burned fuel, rotate, which drives the compressor section 16 and fan 14.

The turbine section 11 includes alternating rows of blades 20 and static airfoils or vanes 19. It should be understood that FIG. 1 is for illustrative purposes only and is in no way intended as a limitation on this disclosure or its application.

An example blade 20 is shown in FIG. 2A. The blade 20 includes a platform 24 supported by a root 22, which is secured to a rotor, for example. An airfoil 26 extends radially outwardly from the platform 24 opposite the root 22 to a tip 28. While the airfoil 26 is disclosed as being part of a turbine blade 20, it should be understood that the disclosed airfoil can also be used as a vane.

Referring to FIGS. 2A and 2B, the airfoil 26 includes an exterior airfoil surface 38 extending in a chord-wise direction C from a leading edge 30 to a trailing edge 32. The airfoil 26 is provided between pressure and suction sides 34, 36 in an airfoil thickness direction T, which is generally perpendicular to the chord-wise direction C. Multiple airfoils 26 are arranged circumferentially in a circumferential direction H. The airfoil 26 extends from the platform 24 in a radial direction R to the tip 28. The exterior airfoil surface 38 may include multiple film cooling holes.

Returning to FIG. 2A, the airfoil 26 includes cooling passages 40 defined by walls 42. The walls 42 include an interior cooling surface 44 exposed to a cooling flow passing through the cooling passage 40. Referring to FIG. 3A, the interior cooling surface 44 is spaced apart from an opposite wall 56 by a distance 58 to provide a cavity 46 between the wall 42 and the opposite wall 56.

The interior cooling surface 44 includes micro-bumps 48 protruding from the interior cooling surface 44 into the cavity 46 of the cooling passage 40. The micro-bumps 48 are discrete from and not contiguous relative to one another in multiple directions X, Y along the interior cooling surface 44. In the example, the micro-bumps 48 are non-contiguous from one another 360° about each micro-bump 48. That is, each micro-bump 48 protrudes from the interior cooling surface 44 in all directions around the micro-bump 48 as opposed to a linear ridge. The micro-bumps 48 may be arranged in a pattern or distributed arbitrarily. The micro-bumps 48 increase turbulence at the boundary layer thereby improving convective heat transfer. The micro-bumps 48 also serve to increase the surface area, which also increases heat transfer. The micro-bumps 48 can be on any surface that is exposed to cooling flow in the airfoil 26, for example, the surface of the ridge mentioned above.

Figure 3C:
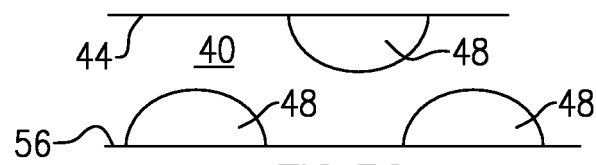
FIG. 3C depicts offset micro-bumps on opposing walls of a cooling passage.

In the example shown in FIG. 3A, the micro-bumps 48 each include a generally spherical cap. The micro-bumps 48 each include a length 50, a width 52 and a height 54. The height 54 is less than the distance 58, such that the micro-bumps 48 are spaced from the opposite wall 56. In the example of spherical-shaped micro-bumps 48, the length 50 and width 52 are equal to one another and correspond to a radius providing a circular base to the micro-bump 48 on the interior cooling surface 44. Two micro-bumps on opposite cooling surfaces may be offset relative to each other (FIG. 3C). Such an offset arrangement can further increase turbulence and as a result, improve convective heat transfer. The stream-wise (direction of cooling flow) offset between two adjacent micro-bumps on a same cooling surface is about 1L to 10L, where L is length 50. The span-wise (perpendicular to the direction of flow) offset between two adjacent micro-bumps on a same cooling surface is about 0.5W to 5W, where W is width 52. Actual offsets can be determined by the wake of cooling flow (shown by dotted lines in FIG. 3A) induced by the micro-bumps 48, which may be calculated by computational fluid dynamics or measured by experiments. Typically the wakes of cooling flow induced by adjacent micro-bumps 48 are designed to be contiguous relative to one another.

The micro-bump 48 may be formed during the airfoil manufacturing process, as discussed below relative to FIG. 5. Alternatively, the micro-bumps 48 may be formed by providing a correspondingly shaped micro-depression 62 on a core 60, as shown in FIG. 3B. The micro-depression 62 may be formed, for example, by an electrodischarge machining process (EDM) or during the core forming process, as described below in connection with FIG. 6. The surfaces of the micro-bumps 48 and micro-depressions 62 formed during those manufacturing process provide a desired roughness that further enhances heat transfer.

Figure 3D:
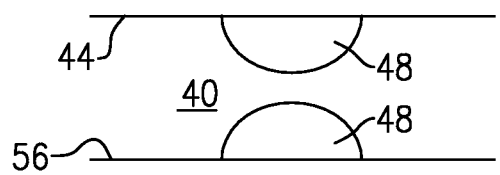
FIG. 3D depicts aligned micro-bumps on opposing walls of a cooling passage.
Figure 4B:
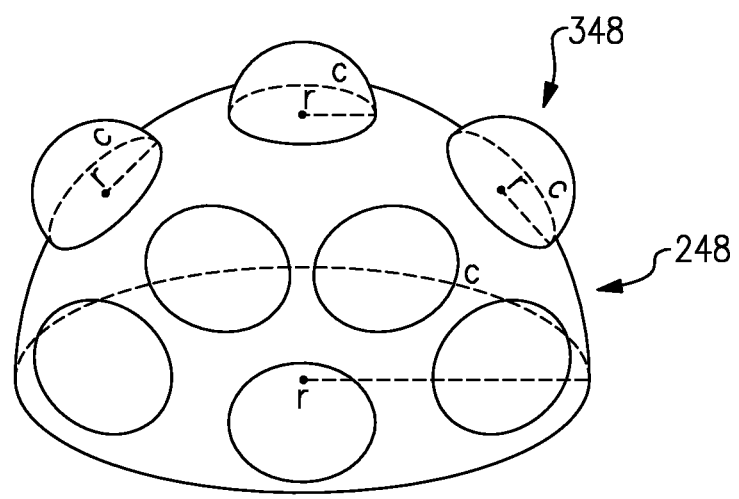
FIG. 4B illustrates another shape of an example micro-bump cluster.

Referring to FIG. 4A, other shaped protrusions 148 may be provided on the interior cooling surface 44. The tear-drop shape depicted in FIG. 4 includes a length 150, a width 152, and a height 154. The lengths 50, 150, widths 52, 152 and heights 54, 154 of the micro-bumps provided on the interior cooling surface 44 are each less than one half of the cavity 46 between the wall 42 and the opposite wall 56 (FIG. 3D). The cavity 46 may vary as the wall 42 and the opposite wall 56 may converge or diverge. The heights 54, 154 of the micro-bumps can be further determined by the thickness of the flow boundary layer of the micro-bump-less cooling wall, which may be calculated by computational fluid dynamics or measured by experiments. Typically, the heights 54, 154 of the micro-bumps may be 10%-200% of the thickness of the flow boundary layer. Other shaped micro-bumps may be used. For example, a micro-bump 248 may include smaller micro-bumps 348 to further increase the surface area, as shown in FIG. 4B.

The airfoil geometries disclosed in FIGS. 3A-3D and 4A-4B may be difficult to form using conventional casting technologies. Thus, an additive manufacturing processes 68, 80 may be used, as schematically illustrated in FIGS. 5 and 6.

Referring to FIG. 5, powdered metal 73 suitable for aerospace airfoil applications is fed to a machine 72, which may provide a vacuum, for example. The machine 72 deposits multiple layers of powdered metal onto one another. The layers are joined to one another with reference to CAD data 70, which relates to a particular cross-section of the airfoil 26 including geometrical data for those micro-bumps. In one example, the powdered metal 73 may be melted using a direct metal laser sintering process or an electron-beam melting process. With the layers built upon one another and joined to one another cross-section by cross-section, an airfoil with the above-described geometries may be produced, as indicated at 74. The airfoil may be post-processed 76 to provide desired structural characteristics. For example, the airfoil may be heated to reconfigure the joined layers into a single crystalline structure, equi-axed or directionally solidified.

Referring to FIG. 6, to form the core 60, powdered metal 82 suitable for refractory metal core applications such as molybdenum, or ceramic/ceramic slurry suitable for ceramic core, is fed to a machine 84, which may provide a vacuum, for example. The machine 84 deposits multiple layers of powdered metal (or ceramic/ceramic slurry) onto one another. The layers are joined to one another with reference to CAD data 86, which relates to a particular cross-section of the core 60 including corresponding micro-depression geometrical data for those micro-bumps. In one example, the powdered metal 82 or ceramic may be melted using a direct metal laser sintering process or an electron-beam melting process. With the layers built upon one another and joined to one another cross-section by cross-section, a core with the above-described geometries may be produced, as indicated at 88. A single piece core can be produced that requires no assembly and can be directly placed into a mold after being coated. The core 60 may be a hybrid core, in which intricate features, such as micro-depression, are made of refractory metal while the remaining features are made of ceramic. That is, the bulk of the core can be investment cast (ceramic or refractory metal, for example) and only the intricate features, such as the micro-bumps, are additively manufactured (using ceramic or refractory metal, for example).

The coating 90 may be applied to the exterior surface of the core 60, which enables the core 60 to be more easily removed subsequently. The core 60 is arranged in a multi-piece mold and held in a desired oriental by features on the mold, as indicated at 92. The core 60 is more robust and can better withstand handling as it is positioned within the mold. The airfoil 26 is cast about the core 60, as indicated at 94. The core 60 is then removed from the airfoil 26, as indicated at 96, to provide desired cooling passage features.

Although example embodiments have been disclosed, a worker of ordinary skill in this art would recognize that certain modifications would come within the scope of the claims. For that reason, the following claims should be studied to determine their true scope and content.

What is claimed is:

1. A method of manufacturing an airfoil comprising the steps of:
depositing multiple layers of powdered metal onto one another;
joining the layers to one another with reference to CAD data relating to a particular cross-section of an airfoil; and
producing the airfoil with leading and trailing edges joined by spaced apart pressure and suction sides to provide an exterior airfoil surface, a cooling passage arranged interiorly of the exterior airfoil surface and providing an interior surface, the interior cooling surface including micro-bumps protruding from the interior cooling surface into the cooling passage, the micro-bumps discrete from and noncontiguous relative to one another in multiple directions along the interior cooling surface, wherein the micro-bumps are noncontiguous from one another 360° about each micro-bump along the interior cooling surface.

2. The method according to claim 1, comprising the step processing the airfoil to provide desired structural characteristics.

3. The method according to claim 2, wherein the processing step includes heating the airfoil to reconfigure the joined layers into at least one of a equi-axed structure, directionally solidified structure and single crystalline structure.

4. The method according to claim 1, wherein at least one of the micro-bumps includes a spherical cap.

5. The method according to claim 1, wherein at least one of the micro-bumps is teardrop shaped.

6. The method according to claim 1, wherein the cooling passage is provided by opposing cooling surfaces, each of the opposing cooling surfaces including first and second micro-bumps that are offset relative to one another.

7. The method according to claim 1, wherein the interior cooling surface and the micro-bumps include a uniform microstructure relative to one another.

8. The method according to claim 1, wherein at least one of the micro-bumps include secondary micro-bumps on the at least one of the micro-bumps.

9. A method of manufacturing an airfoil comprising the steps of:
depositing multiple layers of powdered metal onto one another;

joining the layers to one another with reference to CAD data relating to a particular cross-section of an airfoil; and producing the airfoil with leading and trailing edges joined by spaced apart pressure and suction sides to provide an exterior airfoil surface, a cooling passage arranged interiorly of the exterior airfoil surface and providing an interior surface, the interior cooling surface including micro-bumps protruding from the interior cooling surface into the cooling passage, the micro-bumps discrete from and noncontiguous relative to one another in multiple directions along the interior cooling surface, wherein the interior cooling surface includes first and second micro-bumps adjacent to one another and separated by a length in a stream-wise direction, wherein the length is about 1 to 10 times a micro-bump length, and the first and second micro-bumps are separated in a span-wise direction perpendicular to the stream-wise direction a width, wherein the width is about 0.5 to 5 times a micro-bump width.

10. The method according to claim 9, wherein the micro-bump length and micro-bump width are the same and correspond to a radius providing a circular base to the micro-bump on the interior cooling surface.

11. A method of manufacturing an airfoil comprising the steps of:

depositing multiple layers of powdered metal onto one another;

joining the layers to one another with reference to CAD data relating to a particular cross-section of an airfoil; and producing the airfoil with leading and trailing edges joined by spaced apart pressure and suction sides to provide an exterior airfoil surface, a cooling passage arranged interiorly of the exterior airfoil surface and providing an interior surface, the interior cooling surface including micro-bumps protruding from the interior cooling surface into the cooling passage, the micro-bumps discrete from and noncontiguous relative to one another in multiple directions along the interior cooling surface, wherein the micro-bumps include a height configured to be 10% to 200% of a flow boundary layer thickness along the interior cooling surface.

* * * * *